(12) United States Patent
Takahata et al.

(10) Patent No.: US 6,562,550 B2
(45) Date of Patent: May 13, 2003

(54) PREPARATION OF OPTICAL DISK MASTER

(75) Inventors: Hiroaki Takahata, Tokyo (JP); Hisaji Oyake, Tokyo (JP)

(73) Assignee: TDK Corporation, Tokyo (JP)

( * ) Notice: Subject to any disclaimer, the term of this patent is extended or adjusted under 35 U.S.C. 154(b) by 134 days.

(21) Appl. No.: 09/832,893

(22) Filed: Apr. 12, 2001

(65) Prior Publication Data

US 2001/0044078 A1 Nov. 22, 2001

(30) Foreign Application Priority Data

Apr. 14, 2000 (JP) .................................. 2000-113708
Mar. 15, 2001 (JP) .................................. 2001-073862

(51) Int. Cl.$^7$ ................................................. G03F 7/00
(52) U.S. Cl. ........................ 430/320; 430/322; 430/327
(58) Field of Search ............................... 430/311, 320, 430/322, 329, 331, 270.11, 327

(56) References Cited

U.S. PATENT DOCUMENTS 6,403,283 B1 * 6/2002 Aoshima .................. 430/278.1
6,403,289 B1 * 6/2002 Tanaka ........................ 430/329

FOREIGN PATENT DOCUMENTS

JP           1-317241           12/1989
JP           6-260407            9/1994

* cited by examiner

*Primary Examiner*—Kathleen Duda
(74) *Attorney, Agent, or Firm*—Oblon, Spivak, McClelland, Maier & Neustadt, P.C.

(57) ABSTRACT

An optical disk master having a protrusion/depression pattern on its surface is prepared by applying a photoresist layer on a substrate, exposing the photoresist layer to radiation to form a latent image of the protrusion/depression pattern, and developing the latent image. The step of treating the photoresist layer with a surfactant is included prior to the exposing step or between the exposing and developing steps. An optical disk master having a finer pattern can be prepared at a low cost while minimizing any additional burden on the manufacturing system.

8 Claims, 3 Drawing Sheets

FIB. 1B

■ TREATED
● NOT TREATED

● NOT TREATED
■ SPIN RINSING
✱ DIPPING

× AMPHOLYTIC SURFACTANT
○ NOT TREATED
■ NEUTRAL DETERGENT

○ NOT TREATED
■ PRE-TREATMENT
⊠ POST-TREATMENT
▲ ALKALI TREATMENT

PREPARATION OF OPTICAL DISK MASTER

BACKGROUND OF THE INVENTION

1. Field of the Invention

This invention relates to a method for preparing an optical disk master for use in the manufacture of optical disk substrates.

2. Prior Art

Optical disks include write-once read many or rewritable optical recording disks and read-only disks. The optical recording disks have recording layers formed on disk substrates which are provided on the surface with (guide) grooves for tracking and other purposes. In the read-only disks, information-bearing pits are integrally formed on the surface of disk substrates.

Disk substrates are usually prepared by injection molding resins using a stamper having a negative pit and groove pattern. The stamper is often formed of nickel. In order to manufacture the stamper, an optical disk master is first prepared. The following process is generally employed for preparing the optical disk master. First, a photoresist layer is applied on the surface of a glass substrate. The photoresist layer is exposed to laser beams to form a latent image of the desired pattern, followed by development.

Using the optical disk master, a stamper is manufactured usually by the following process. First, to impart electric conductivity to the surface of the photoresist layer on the optical disk master, a metal thin film of nickel or the like is formed as by sputtering or electroless plating. Electroforming is then effected to deposit a film of nickel or the like on the metal thin film. Then the laminate of the metal thin film and the electroformed film is stripped from the photoresist layer. The laminate is ready for use as the stamper master. This stamper master may be used as the stamper directly, although a stamper mother may be prepared from the stamper master and used as the stamper. The stamper mother is prepared by electroforming a film on the surface of the stamper master and striping the electroformed film. It is recommended to previously oxidize the surface of the stamper master so that the electroformed film may be readily stripped therefrom. Alternatively, a stamper child may be similarly prepared using the stamper mother and used as the stamper.

In the process of preparing an optical disk master, the minimum width of the latent image pattern formed in the photoresist layer is limited by the diameter of a laser beam spot. The beam spot diameter w is represented by $w = k \cdot \lambda / NA$ wherein $\lambda$ is the wavelength of the laser beam, NA is the numerical aperture of an objective lens in an optical system, and k is a constant which is determined by the aperture shape of the objective lens and the intensity distribution of an incident light flux. Therefore, to reduce the pit or groove width, the wavelength of the laser beam must be decreased or the numerical aperture of the objective lens be increased.

However, since an objective lens having a numerical aperture in excess of 0.9 has been already developed and used in practice, there is left little room for further improvement. As to the laser wavelength, a blue laser of short wavelength has been used in practice. Then, to further reduce the minimum width of a latent image pattern, a laser beam of a shorter wavelength, for example, in the ultraviolet region must be used. On use of a laser beam in the ultraviolet region, however, optical components including the objective lens should be changed to those capable of complying with the ultraviolet region. This gives rise to a serious problem that a substantial modification of the system is needed.

JP-A 1-317241 proposes a process of preparing an optical disk master wherein the steps of immersing an unexposed photoresist film in a developer or showering the developer to the unexposed photoresist film, followed by water washing and drying are added prior to the step of exposing the photoresist film to radiation. By adding the developing, washing and drying steps prior to the exposure step, the photoresist film surface is substantially insolubilized, allowing grooves or pits to be formed to a narrower width or smaller diameter. In this patent, the development prior to exposure is effected at a concentration of 50% for a time duration of 10 seconds.

JP-A 6-260407 discloses a process for forming a resist pattern by applying a photoresist layer onto a semiconductor substrate, treating the photoresist layer with an alkali to form an insolubilized stratum in the surface of the photoresist layer, followed by exposure and development. The mechanism of this process is as follows. As a result of the alkali treatment, low molecular weight components in the photoresist are dissolved out under the action of alkali, whereby the surface of the photoresist layer is hardened, and at the same time, the alkali causes azo-coupling reaction to take place between the novolac resin and photosensitive groups in the photoresist to form an insolubilized stratum in the photoresist layer surface. This insolubilized stratum holds down the dissolution rate in the unexposed areas of the photoresist layer, resulting in an improvement in the resolution of the positive acting photoresist. In the patent, the alkali treatment is effected by building up a quaternary ammonium hydroxide solution on the photoresist layer.

In the above-referred JP-A 1-317241 and 6-260407, the photoresist layer is substantially insolubilized by treating with a developer or quaternary ammonium hydroxide solution, thereby achieving an improved resolution. Such alkaline solutions as the developer and quaternary ammonium hydroxide solution need safe disposal as by neutralization, inviting a cost increase.

The photoresist becomes alkali soluble upon exposure. Therefore, the alkali treatment must be done prior to exposure as described in the above-referred patents. The alkali treatment is carried out by immersion in alkaline solution or by showering of alkaline solution, which must inevitably be followed by washing with pure water and drying. Since the photolithographic system of carrying out a series of steps in an in-line mode does not usually have washing and drying units incorporated between the photoresist applying step and the exposure step, the alkali treatment must be carried out off-line.

SUMMARY OF THE INVENTION

An object of the invention is to provide a method for preparing an optical disk master having a finer pattern at a reduced cost and with a minimal burden on the manufacturing system.

The invention is directed to a method for preparing an optical disk master having a protrusion/depression pattern on its surface, comprising the steps of applying a photoresist layer on a substrate, exposing the photoresist layer to radiation to form a latent image of the protrusion/depression pattern, and developing the latent image. According to the invention, the step of treating the photoresist layer with a surfactant is provided prior to the exposing step or between the exposing step and the developing step. The treating step is preferably effected between the exposing step and the developing step. The treating step preferably includes bringing a solution of the surfactant in contact with the photoresist layer by spin rinsing or dipping. Typically the surfactant is a nonionic surfactant. Preferably the treating step uses a surfactant solution having a concentration of 0.1 to 10% by weight of the surfactant.

The exposing step is preferably to expose the photoresist layer to a dose of radiation $D_1$ which satisfies the relationship: $1.1 \leq D_1/D_0 \leq 2$ wherein $D_0$ is the optimum exposure dose for the photoresist layer when the treating step is excluded.

BRIEF DESCRIPTION OF THE INVENTION

DESCRIPTION OF THE PREFERRED EMBODIMENT

Figure 1A:
FIG. 1 illustrates a series of steps for preparing an optical disk master according to the invention and manufacturing a stamper master therefrom.

A typical prior art method for preparing an optical disk master involves the steps of applying a photoresist layer on a substrate, exposing the photoresist layer to a laser beam which is a Gaussian beam to form a latent image, and developing the latent image.

According to the invention, the step of treating the photoresist layer with a surfactant is provided between the applying step and the exposing step or between the exposing step and the developing step. Contacting the photoresist layer with the surfactant prior to or subsequent to the exposure step enables to form a finer pattern.

Although the reason why the effective beam spot diameter can be reduced by the surfactant treatment is not well understood, it is believed that development following the surfactant treatment is selectively restrained in the in-plane direction of the photoresist layer. When a comparison is made under such conditions that a depression pattern reaches the bottom of the photoresist layer, the invention can form a depression pattern of a narrower width than in the prior art.

In the above-referred JP-A 1-317241 and 6-260407, the photoresist layer is substantially insolubilized with a developer or quaternary ammonium hydroxide solution, thereby achieving an improved resolution. The present invention is analogous to these patents in that the photoresist layer is substantially insolubilized by treatment with an agent. However, unlike alkaline agents such as the developer or quaternary ammonium hydroxide, the surfactant used in the invention does not need careful disposal or neutralization of spent solution. Additionally, the surfactants are inexpensive as compared with the alkaline agents. In the practice of the invention, even commercially available inexpensive neutral detergents can be used in a concentration as low as about 1% as the nonionic surfactant. The invention is successful in minimizing any cost increase associated with the additional treatment.

Since the photoresist which has turned to be alkali soluble following exposure is not dissolved in the surfactant, the step of surfactant treatment according to the invention can be effected subsequent to the exposure step. As previously described, the in-line photolithographic system does not have washing and drying units incorporated between the photoresist applying step and the exposure step, the prior art alkali treatment to be incorporated prior to the exposure step has to be an off-line operation. By contrast, the developing step following the exposure step has a margin to modify some piping and the sequence such that steps of surfactant treatment, water washing and drying can be incorporated as in-line steps prior to the developing step. Therefore, the invention permitting surfactant treatment to be effected between the exposure step and the developing step is applicable to the prior art in-line photolithographic system.

Referring to FIGS. 1A to 1F, the method of preparing an optical disk master according to the invention is illustrated step by step.

First, a substrate 1 is furnished as shown in FIG. 1A. The substrate 1 formed of glass has been polished on one surface, cleaned and dried. Typically the substrate 1 has a coupling layer pre-formed on the surface for enhancing the adhesion of a photoresist layer to be applied thereto. It is noted that the substrate 1 can be formed of any desired material other than glass.

Then, as shown in FIG. 1B, a photoresist layer 2 of positive photoresist material is applied onto the substrate 1. The photoresist layer 2 is formed by coating a resist solution and pre-baking or heat treatment for evaporating off the solvent. The thickness of the photoresist layer 2 may be properly determined by taking into account the desired depth of pits or grooves although the thickness is usually in the range of about 20 to 200 nm. The photoresist material used is not critical although preferred are those photoresist materials which have a high sensitivity, are not strippable upon development and give a very smooth surface. Such photoresist materials are commercially available under the trade name of OFPR and TSMR series from TOK Co., Ltd., AZ1500 and AZ7000 series from Clariant Corp., DVR series from Nippon Zeon Co., Ltd., and S1800 and S9900 series from Shipley Co.

Next, the photoresist layer is surface treated with a surfactant. For the surfactant treatment, the photoresist layer is preferably contacted with a solution of the surfactant by spin rinsing or dipping. The surfactant solution preferably has a concentration of 0.1 to 10% by weight. Too low a concentration may result in insufficient treatment whereas too high a concentration has the propensity for the surfactant to be left on the photoresist layer surface even after water washing, which can cause uneven development. The surfactant used herein is not critical and a choice may be made among a variety of surfactants including ampholytic, anionic, cationic and nonionic surfactants. Water is often used as the solvent.

The time duration for which the surfactant is kept in contact with the photoresist layer is not critical. For intimate contact, a contact time of at least 10 seconds is recommended. However, it is unnecessary to keep contact over 120 seconds because merely increasing the contact time does not enhance the effect of treatment.

It is understood that the surfactant treatment may also be effected between the exposure step and the developing step.

Figure 1C:
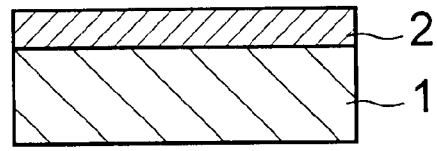
Figure 1C:
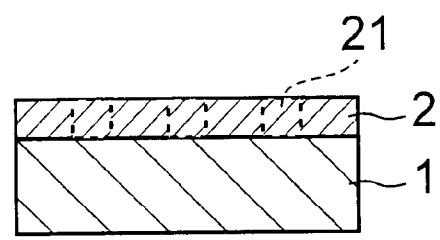

After the surfactant treatment, the photoresist layer is thoroughly washed with water and dried. Next, the photoresist layer is exposed to a desired pattern of laser beam by means of a laser beam recorder, forming a latent image pattern 21 as shown in FIG. 1C. The exposure conditions may be as conventional although a more exposure dose is usually preferred. Specifically, the photoresist layer is exposed to a dose of radiation $D_1$ which satisfies the following relationship.

$$1.1 \leq D_1/D_0 \leq 2$$

Herein $D_0$ is the optimum exposure dose for the photoresist layer when the surfactant treatment is excluded and $D_1$ is the exposure dose for the photoresist layer when the surfactant treatment is included. As a result of the surfactant treatment, development is somewhat restrained and the dissolution of the photoresist layer to the desired pattern is somewhat retarded, which necessitates to prolong the developing time. However, a longer time of development can cause the photoresist layer to be stripped. It is thus desired to set $D_1/D_0$ at 1.1 or greater to avoid the long term development. Too large values of $D_1/D_0$, however, increase too much the rate of dissolution of the photoresist layer to the desired pattern so that the necessary developing time becomes too short. As a result, development control becomes difficult and the reproducibility of development becomes insufficient. It is then desired to limit $D_1/D_0$ at 2 or less. The optimum exposure dose means an exposure dose which allows the depression pattern to fully reach the bottom of the photoresist layer at the end of development, that is, the pattern is well defined by full dissolution and with a minimal collapse of the pattern profile. Since the invention does not require the exposure dose to be significantly increased as compared with the prior art, the extra burden on the laser beam recorder is small.

Figure 1D:
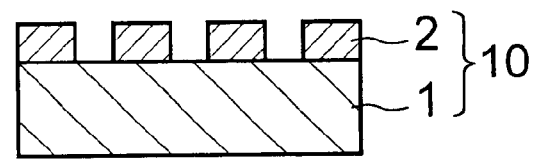

Development following exposure results in a patterned photoresist layer 2. There is obtained an optical disk master 10 having the patterned photoresist layer 2 as shown in FIG. 1D. The developing conditions are not critical and may be conventional. Preferably the developing time is about 10 to about 150 seconds, and more preferably about 20 to about 120 seconds. Too short a developing time makes the development control difficult whereas too long a developing time can cause the photoresist layer to be stripped.

Figure 1E:
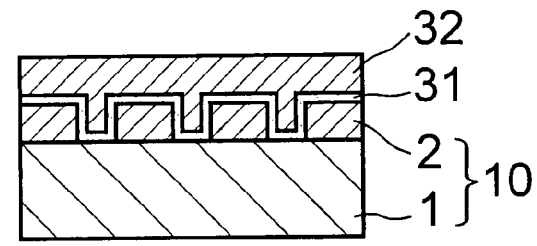
Figure 1F:
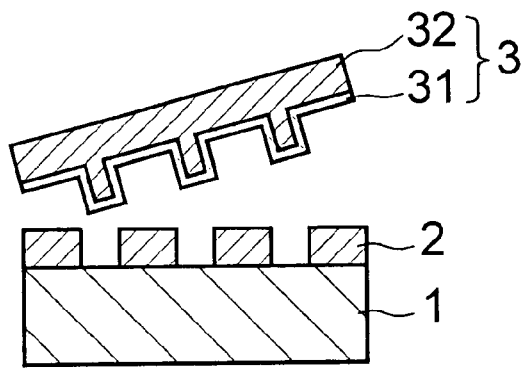

After development and post-baking, if necessary, a metal thin film 31 of nickel or the like is formed on the photoresist layer-bearing surface. The metal thin film 31 may be deposited, for example, by electroless plating or sputtering. Next, by electroforming, a metal film 32 of nickel or the like is formed on the metal thin film 31 as shown in FIG. 1E. The laminate consisting of the metal thin film 31 and the metal film 32 is stripped from the photoresist layer-bearing surface. This laminate becomes a stamper master 3.

EXAMPLE

Examples of the invention are given below by way of illustration and not by way of limitation.

Example 1 (Ampholytic Surfactant)

A positive acting resist OFPR-800 by TOK Co., Ltd. was applied onto a disk-shaped glass substrate by spin coating and heat treated to form a photoresist layer of about 150 nm thick.

Next, the photoresist layer on the surface was treated with a 1% solution of an ampholytic surfactant in pure water by spin rinsing for 30 seconds. The ampholytic surfactant used was alkylammonium chloride CP-6 by Create Chemicals Co., Ltd. After the treatment, the photoresist layer was washed with water by spin rinsing with ultrapure water for 90 seconds.

Using a laser beam recorder including an optical system whose objective lens has a numerical aperture of 0.90 and a laser radiation source with a wavelength of 413 nm, the photoresist layer was exposed to a laser beam to form a latent image consisting of a pit pattern and a groove pattern. The exposure dose was set to give a $D_1/D_0$ of 1.4.

Next, the exposed resist layer was developed with Microposit Developer by Shipley, yielding an optical disk master. Then electroless nickel plating was effected to form a nickel thin film on the photoresist layer-bearing surface. Another nickel film was electroformed on the nickel thin film. The laminate of the nickel thin film and the electroformed nickel film was stripped from the substrate, yielding a stamper. Injection molding of polycarbonate was carried out using the stamper, producing an optical disk substrate of polycarbonate.

For comparison purposes, a (conventional) optical disk substrate was manufactured as above except that the surfactant treatment was omitted.

These optical disk substrates were measured for pit and groove widths under a scanning electron microscope. The optical disk substrate according to the invention had pit and groove widths which are about 20% smaller than those of the conventional optical disk substrate. The data demonstrate the effectiveness of the invention.

Example 2 (Ampholytic Surfactant)

A photoresist layer was applied as in Example 1 except that the thickness was about 200 nm. It was then treated with a surfactant and washed with water as in Example 1. Using the same laser beam recorder as in Example 1, a latent image consisting of pit and groove patterns was formed in the photoresist layer. Exposure was effected such that the dose may continuously decrease from the inner periphery to the outer periphery. The subsequent procedure was the same as in Example 1, obtaining an optical disk substrate.

For comparison purposes, a (conventional) optical disk substrate was manufactured as above except that the surfactant treatment was omitted.

Figure 2:
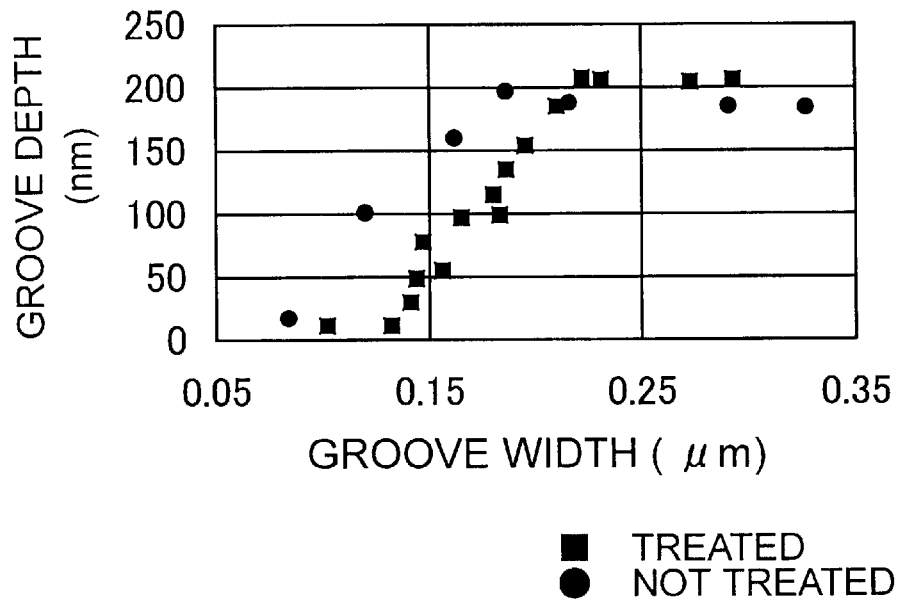
FIG. 2 is a diagram showing a groove width versus a groove depth.

These optical disk substrates were measured for groove width under a scanning electron microscope. FIG. 2 shows the width and depth of the groove in the optical disk substrates. In the area exposed to a large dose of radiation, the groove reaches the lower surface of the photoresist layer and has a U-shaped cross section of increased width since the dose is sufficient even at the periphery of a beam spot. The groove width decreases as the exposure dose decreases. When the exposure dose is further reduced, the groove does not reach the lower surface of the photoresist layer and has a V-shaped cross section. The groove width when the cross-sectional shape changes from U shape to V shape is herein designated the minimum groove width that can be achieved. The minimum groove width was 0.18 μm for the optical disk substrate manufactured according to the invention and 0.23 μm for the conventional optical disk substrate. This indicates that the invention permits the minimum groove width to be reduced about 20%.

Example 3 (Ampholytic Surfactant)

An optical disk substrate was manufactured as in Example 2 except that the surfactant treatment was effected by dipping for 90 seconds. Like the optical disk substrate of Example 2, the optical disk substrate of this example achieves a reduction of about 20% in the minimum groove width as compared with the conventional optical disk substrate.

Figure 3:
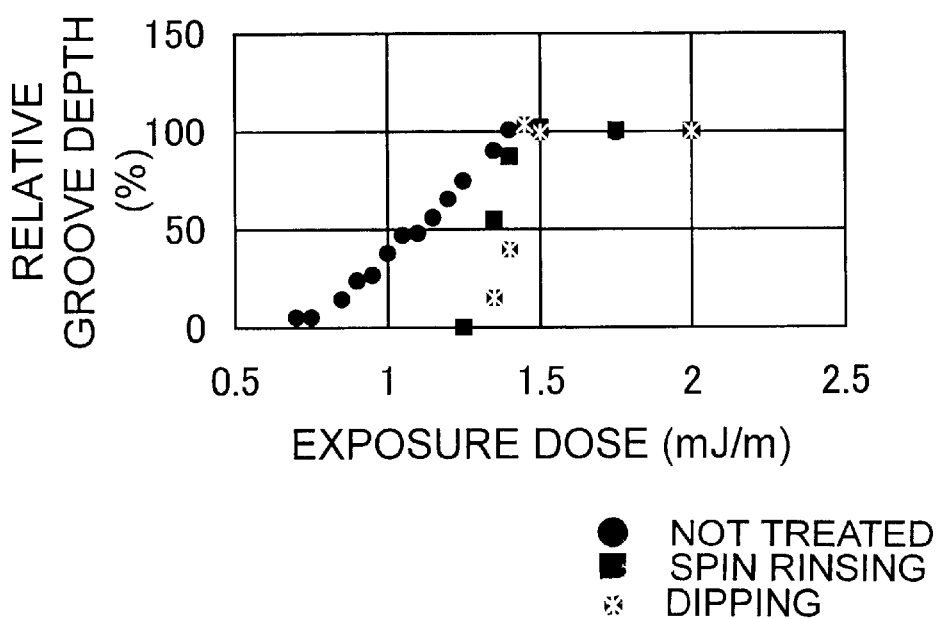
FIG. 3 is a diagram showing a relative groove depth versus an exposure dose.

FIG. 3 shows a relative groove depth as a function of exposure dose. FIG. 3 also shows the data for the optical disk substrate manufactured through surfactant treatment by spin rinsing and the conventional optical disk substrate manufactured without surfactant treatment. It is noted that the relative groove depth is the ratio (percent) of groove depth to photoresist layer thickness. The invention provides a very high change rate (resolution) of the relative groove depth with the exposure dose. A high resolution corresponds to a high threshold of development, contributing to formation of a narrower groove. It is presumed from the results that the effectiveness of the invention is correlated to an improvement in resolution.

Example 4 (Nonionic Surfactant)

An optical disk substrate was manufactured as in Example 2 except that a 1% solution of a nonionic surfactant (Clean Ace by Iuchi Seieido Co. Ltd., neutral detergent for instrument cleansing) in pure water was used instead of the 1% ampholytic surfactant solution. Like the optical disk substrate of Example 2, the optical disk substrate of this example achieves a reduction of about 20% in the minimum groove width as compared with the conventional optical disk substrate.

Figure 4:
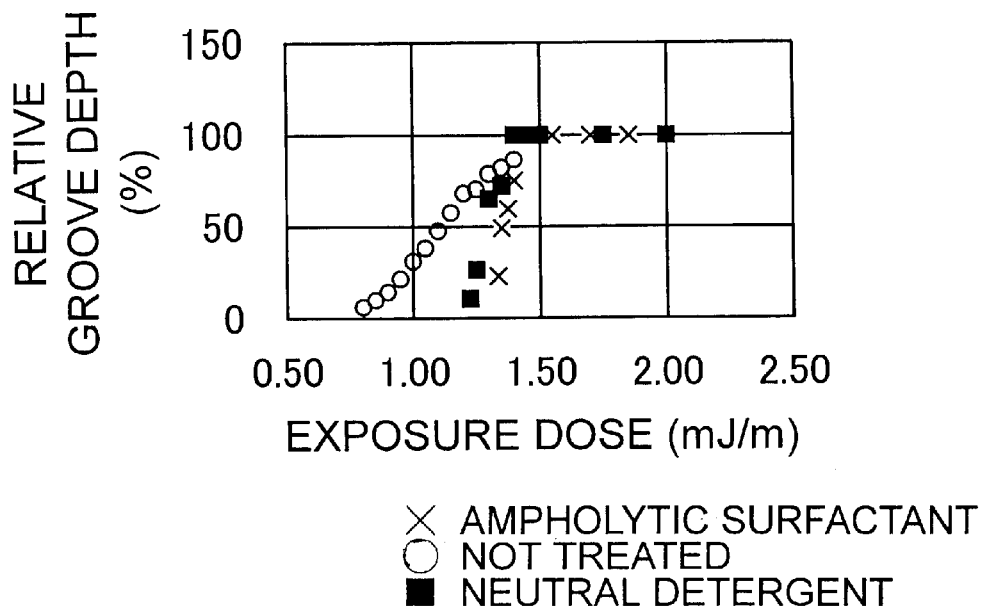
FIG. 4 is a diagram showing a relative groove depth versus an exposure dose.

FIG. 4 shows a relative groove depth as a function of exposure dose. FIG. 4 also shows the data for the optical disk substrate manufactured through treatment with the ampholytic surfactant and the conventional optical disk substrate manufactured without surfactant treatment. It is seen from FIG. 4 that the use of a neutral detergent (nonionic surfactant) provides a very high change rate (resolution) of the relative groove depth with the exposure dose as does the ampholytic surfactant.

Example 5

Comparison of Treatment Prior to Exposure with Treatment Subsequent to Exposure

An optical disk substrate was manufactured as in Example 4 except that the exposure step was followed by the surfactant treatment. Like the optical disk substrate of Example 4 (wherein the surfactant treatment step was followed by the exposure step), the optical disk substrate of this example achieves a reduction of about 20% in the minimum groove width as compared with the conventional optical disk substrate.

For comparison purposes, an optical disk substrate was prepared as in Example 4 except that alkaline treatment with the developer was effected instead of the surfactant treatment. Like the optical disk substrate of Example 4, this comparative optical disk substrate achieves a reduction of about 20% in the minimum groove width as compared with the conventional optical disk substrate.

Figure 5:
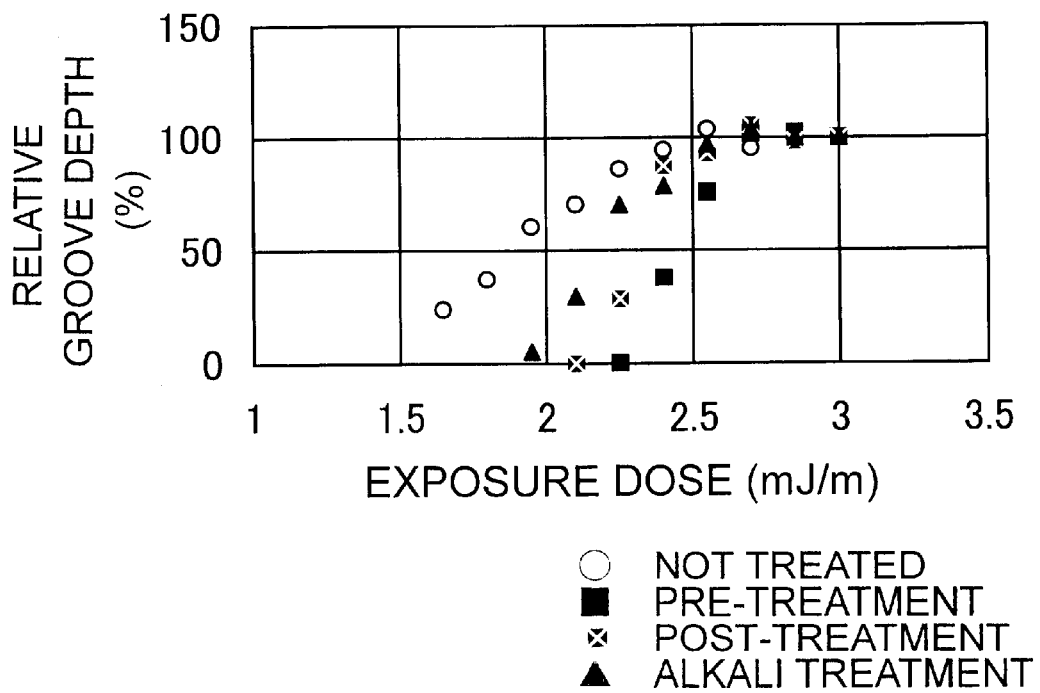
FIG. 5 is a diagram showing a relative groove depth versus an exposure dose.

FIG. 5 shows a relative groove depth as a function of exposure dose for the optical disk substrate (post-treatment) in which the exposure step was followed by the surfactant treatment. FIG. 5 also shows the data for the optical disk substrate (pre-treatment) in which the surfactant treatment step was followed by the exposure step as in Example 4, the comparative optical disk substrate prepared through alkaline treatment, and the conventional optical disk substrate manufactured without surfactant treatment. It is seen from FIG. 5 that in both the pre-treatment and post-treatment, the change rate (resolution) of the relative groove depth with the exposure dose is at least comparable to that associated with the alkaline treatment.

Example 6

Comparison in Terms of Surfactant Concentration

An optical disk substrate was manufactured as in Example 2 except that the photoresist layer was 30 nm thick and the concentration of the surfactant solution and the developing time were changed as shown in Table 1. Also, the incident light flux diameter to the objective lens in the laser beam recorder was changed so as to give a beam spot diameter (diameter giving $1/e^2$ of the center intensity in a Gaussian beam) of 0.37 μm whereas the beam spot diameter in Example 2 was 0.45 μm. It is noted that the developing time in Table 1 is a time duration of development taken until a latent image of a monitor groove formed at an exposure dose of 2 mJ/m becomes a visible image having a width of 0.25 μm.

These optical disk substrates were measured for minimum groove width as in Example 2. The photoresist model as developed was visually inspected for development variation. The results are shown in Table 1.

TABLE 1

| Run No. | Solution Concentration (%) | Developing time (s) | Minimum Groove width (μm) | Variation |
|---|---|---|---|---|
| 101* | Not treated | 47 | 0.185 | Nil |
| 102 | 0.1 | 75 | 0.15 | Nil |
| 103 | 1 | 126 | 0.14 | Nil |
| 104 | 5 | 121 | 0.135 | Nil |
| 105 | 10 | 107 | 0.14 | Some |
| 106 | 20 | 118 | 0.14 | varied |

*conventional

It is evident from Table 1 that the surfactant treatment is effective for reducing the minimum groove width even when the surfactant solution has a concentration of 0.1%. It is also seen that the surfactant treatment requires to prolong the developing time. As long as the solution concentration is 1% or higher, the necessary developing time remains substantially unchanged with an increasing concentration, and the minimum groove width remains substantially unchanged as well.

Example 7

Comparison in Terms of Exposure Dose

An optical disk substrate was manufactured as in Example 2 except that the surfactant solution had a concentration of 1%, the exposure dose was set so as to give a $D_1/D_0$ value as shown in Table 2, and the developing time was as shown in Table 2. Also, the beam spot diameter was 0.37 μm. The developing time for each run in Table 2 was determined by utilizing a monitor groove as in Example 6, and for the monitor groove, the exposure dose in each run was set to a factor of $D_1/D_0$.

These optical disk substrates were measured for minimum groove width as in Example 2. The results are shown in Table 2.

TABLE 2

| Run No. | Solution concentration (%) | $D_1/D_0$ | Developing time (s) | Minimum groove Width (μm) |
|---|---|---|---|---|
| 201* | Not treated | 1 | 47 | 0.185 |
| 202 | 1 | 1 | 126 | 0.14 |
| 203 | 1 | 1.1 | 76 | 0.135 |
| 204 | 1 | 1.5 | 30 | 0.14 |
| 205 | 1 | 2 | 13 | 0.135 |

*conventional

It is seen from Table 2 that the developing time can be reduced by increasing the exposure dose. The minimum groove width remains substantially unchanged with an increasing exposure dose.

Benefits of the Invention

In the method for the preparation of an optical disk master according to the invention, the step of surface treating the photoresist layer with a surfactant is provided prior to or subsequent to exposure, allowing pits or grooves of a smaller size to be formed in the photoresist layer than in the prior art. The surfactant is inexpensive and eliminates a need for a special treatment or neutralization of used solution. The invention can be practiced in the existing optical disk master production system without adding any special unit thereto.

Japanese Patent Application Nos. 2000-113708 and 2001-073862 are incorporated herein by reference.

What is claimed is:

1. A method for preparing an optical disk master having a protrusion/depression pattern on its surface, comprising the steps of:

applying a photoresist layer on a substrate, exposing the photoresist layer to radiation to form a latent image of the protrusion/depression pattern, developing the latent image, and treating the photoresist layer with a non-alkaline surfactant prior to the exposing step or between the exposing step and the developing step.

2. The method of claim 1 wherein said surfactant is a nonionic surfactant.

3. The method of claim 1 wherein the treating step is effected between the exposing step and the developing step.

4. The method of claim 1 wherein the treating step uses a surfactant solution having a concentration of 0.1 to 10% by weight of the surfactant.

5. The method of claim 1 wherein the exposing step is to expose the photoresist layer to a dose of radiation $D_1$ which satisfies the relationship:

$$1.1 \leq D_1/D_0 \leq 2$$

wherein $D_0$ is the optimum exposure dose for the photoresist layer when the treating step is excluded.

6. The method of claim 1 wherein the treating step includes bringing a solution of the surfactant in contact with the photoresist layer by spin rinsing or dipping.

7. The method of claim 1, wherein said surfactant is an ampholytic surfactant.

8. The method of claim 1, wherein the treating step is effected prior to the exposing step.

* * * * *